(12) United States Patent
Lee et al.

(10) Patent No.: US 11,410,862 B2
(45) Date of Patent: Aug. 9, 2022

(54) APPARATUS FOR PROCESSING SUBSTRATE INCLUDING COOLING MEMBER CLOSER TO CENTRAL AXIS THAN HEATING MEMBER

(71) Applicant: SEMES CO., LTD., Chungcheongnam-do (KR)

(72) Inventors: Jaeseong Lee, Hwaseong-si (KR); Kihoon Choi, Cheonan-si (KR); Hae-Won Choi, Daejeon (KR); Anton Koriakin, Cheonan-si (KR); Chan Young Heo, Hwaseong-si (KR); Do Heon Kim, Cheonan-si (KR); Ji Soo Jeong, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 660 days.

(21) Appl. No.: 16/396,736

(22) Filed: Apr. 28, 2019

(65) Prior Publication Data

US 2019/0333788 A1 Oct. 31, 2019

(30) Foreign Application Priority Data

Apr. 30, 2018 (KR) .......................... 10-2018-0050048

(51) Int. Cl.
*H01L 21/67* (2006.01)
*H01L 21/02* (2006.01)

(52) U.S. Cl.
CPC .. *H01L 21/67103* (2013.01); *H01L 21/02057* (2013.01); *H01L 21/02101* (2013.01); *H01L 21/67034* (2013.01); *H01L 21/67126* (2013.01)

(58) Field of Classification Search
CPC ......... H01L 21/67103; H01L 21/67109; H01L 21/67098; H01L 21/67115; H01L 21/67248
See application file for complete search history.

(56) References Cited

FOREIGN PATENT DOCUMENTS

| KR | 10-0295706 B | 5/2001 |
|---|---|---|
| KR | 10-0687378 B1 | 2/2007 |
| KR | 10-2008-0013052 A | 2/2008 |
| KR | 10-0822373 B | 4/2008 |
| KR | 10-2008-0058622 A | 6/2008 |
| KR | 20080058622 A * | 6/2008 |
| KR | 10-1384320 B | 4/2014 |
| KR | 10-2017-0137245 A | 12/2017 |
| KR | 10-1910801 B | 10/2018 |

OTHER PUBLICATIONS

Korean Patent Office, Office action dated Oct. 16, 2019.
Korean Patent Office, Notice of Allowance dated Jun. 2, 2020.

* cited by examiner

*Primary Examiner* — John P. Dulka
(74) *Attorney, Agent, or Firm* — Li & Cai Intellectual Property (USA) Office

(57) ABSTRACT

An apparatus for processing a substrate includes a chamber having a processing space inside, a substrate support unit that supports the substrate in the processing space, and a temperature adjustment unit that is installed in the chamber and that adjusts temperature in the processing space. The temperature adjustment unit includes a heating member that heats the processing space and a cooling member that cools the processing space. The cooling member is located closer to a central axis of the chamber than the heating member.

8 Claims, 10 Drawing Sheets

APPARATUS FOR PROCESSING SUBSTRATE INCLUDING COOLING MEMBER CLOSER TO CENTRAL AXIS THAN HEATING MEMBER

CROSS-REFERENCE TO RELATED APPLICATIONS

A claim for priority under 35 U.S.C. § 119 is made to Korean Patent Application No. 10-2018-0050048 filed on Apr. 30, 2018, in the Korean Intellectual Property Office, the entire contents of which are hereby incorporated by reference.

BACKGROUND

Embodiments of the inventive concept described herein relate to an apparatus for processing a substrate.

In order to manufacture semiconductor devices, desired patterns are formed on a substrate through various processes such as photolithography, etching, ashing, ion implantation, thin film deposition, and the like. Various processing liquids are used in the processes, and contaminants and particles are generated during the processes. A cleaning process for removing the contaminants and the particles from the substrate is necessarily performed before and after each process.

In the cleaning process, the substrate is generally processed with a chemical and a rinsing solution and then dried. The drying process is a process for drying the rinsing solution remaining on the substrate. In the drying process, the rinsing solution on the substrate is replaced by an organic solvent such as isopropyl alcohol (IPA), the surface tension of which is lower than that of the rinsing solution, and thereafter the organic solvent is removed. However, due to the scaling-down of the critical dimension (CD) between the patterns formed on the substrate, it is not easy to remove the organic solvent remaining in the spaces between the patterns.

Recently, a process of removing an organic solvent remaining on a substrate by using a supercritical fluid has been used. The supercritical process is performed in a high-temperature and high-pressure space sealed from the outside, in order to satisfy a specific condition of the supercritical fluid.

In the high-temperature and high-pressure space, uniform heat convection is not achieved, and a temperature distribution is asymmetric. In general, the central portion of the space in which the substrate is processed has a higher temperature than the edge portion of the space. Therefore, drying throughput by the supercritical fluid may vary depending on regions of the substrate, which may lead to a process failure.

SUMMARY

Embodiments of the inventive concept provide an apparatus for uniformly adjusting a temperature distribution in an enclosed space.

According to an exemplary embodiment, an apparatus for processing a substrate includes a chamber having a processing space inside, a substrate support unit that supports the substrate in the processing space, and a temperature adjustment unit that is installed in the chamber and that adjusts temperature in the processing space. The temperature adjustment unit includes a heating member that heats the processing space and a cooling member that cools the processing space. The cooling member is located closer to a central axis of the chamber than the heating member.

The heating member and the cooling member may have longitudinal directions parallel to each other.

The chamber may include an upper body and a lower body combined with the upper body to form the processing space inside. The apparatus may further include an actuator that moves at least one of the upper body and the lower body in a moving direction for a position change between a closed position in which the processing space is closed and an open position where the processing position is open. The longitudinal directions of the heating member and the cooling member may be parallel to the moving direction. The heating member may include a plurality of heaters with a bar shape, and the cooling member may include a plurality of coolers with a bar shape. The heaters may be combined together to have a ring shape when viewed from above, and the coolers may be combined together to have a ring shape when viewed from above.

The chamber may have cooling recesses formed therein, into which the coolers are inserted. Each of the coolers may include a first part having a first thermal conductivity for the chamber and a second part extending from the first part and having a second thermal conductivity for the chamber, the second thermal conductivity being lower than the first thermal conductivity. The first part may be located closer to the processing space than the second part.

The first part may have a larger width than the second part. The first part may be brought into contact with one surface forming a corresponding one of the cooling recesses, and the second part may be spaced apart from the one surface. The cooling member may further include an outer body that surrounds a space between the second part and the one surface. The outer body may be formed of a heat insulating material for blocking heat exchange between the second part and the one surface.

The apparatus may further include a gas supply unit that supplies gas into the processing space. The gas supply unit may supply the gas into the processing space such that pressure in the processing space is raised to more than critical pressure of the gas by the gas supplied into the processing space.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
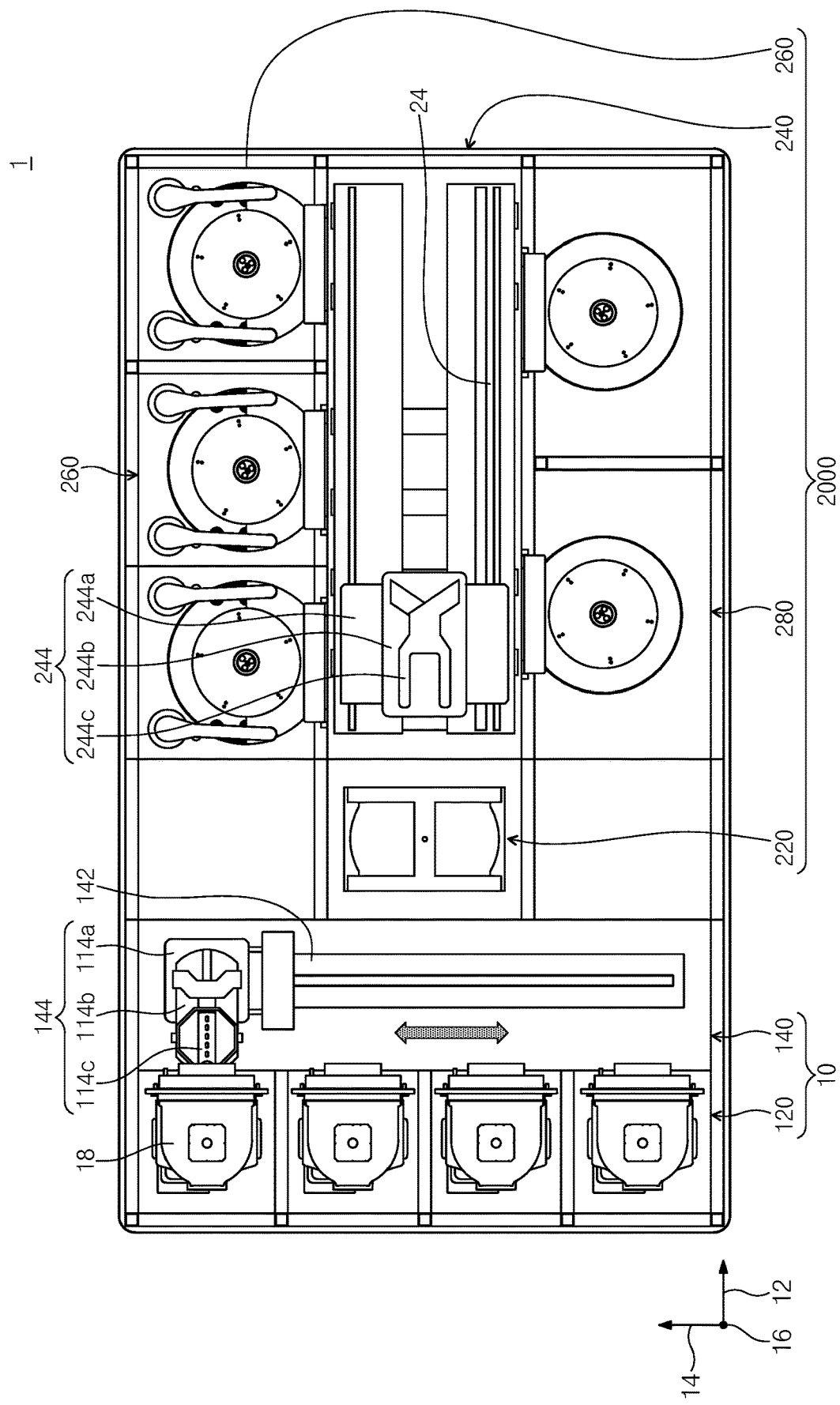
FIG. 1 is a plan view illustrating substrate processing equipment according to an embodiment of the inventive concept.

The inventive concept may, however, be embodied in different forms and should not be constructed as limited to the embodiments set forth herein. Rather, these embodiments are provided so that the inventive concept will be thorough and complete, and will fully convey the scope of the inventive concept to those skilled in the art. Accordingly, in the drawings, the dimensions of components are exaggerated for clarity of illustration.

Hereinafter, embodiments of the inventive concept will be described in detail with reference to FIGS. 1 to 11.

FIG. 1 is a plan view illustrating substrate processing equipment 1 according to an embodiment of the inventive concept.

Referring to FIG. 1, the substrate processing equipment 1 has an index module 10 and a processing module 20. The index module 10 has load ports 120 and a transfer frame 140. The load ports 120, the transfer frame 140, and the processing module 20 are sequentially arranged in a row. Hereinafter, the direction in which the load ports 120, the transfer frame 140, and the processing module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

Carriers 18 having substrates W received therein are placed on the load ports 120. The plurality of load ports 120 are arranged in a row along the second direction 14. FIG. 1 illustrates one example that the index module 10 includes four load ports 120. However, the number of load ports 120 may be increased or decreased depending on conditions such as process efficiency and footprint of the processing module 20. Each of the carriers 18 has a plurality of slots (not illustrated) that are formed therein to support the edges of the substrates W. The plurality of slots are arranged along the third direction 16, and the substrates W are stacked one above another with a spacing gap therebetween in the carrier 18 along the third direction 16. A front opening unified pod (FOUP) may be used as the carrier 18.

The processing module 20 has a buffer unit 220, a transfer chamber 240, first process units 260, and second process units 280. The transfer chamber 240 is arranged such that the longitudinal direction thereof is parallel to the first direction 12. The first process units 260 are arranged on one side of the transfer chamber 240 along the second direction 14, and the second process units 280 are arranged on an opposite side of the transfer chamber 240 along the second direction 14. The first process units 260 and the second process units 280 may be symmetric to each other with respect to the transfer chamber 240. Some of the first process units 260 may be arranged along the longitudinal direction of the transfer chamber 240. Furthermore, other first process units 260 are stacked one above another. That is, the first process units 260 may be arranged in an A×B array (A and B being natural numbers of 1 or larger) on the one side of the transfer chamber 240. Here, A denotes the number of first process units 260 arranged in a row along the first direction 12, and B denotes the number of first process units 260 arranged in a column along the third direction 16. In the case where four or six first process units 260 are disposed on the one side of the transfer chamber 240, the first process units 260 may be arranged in a 2×2 or 3×2 array. The number of first process units 260 may be increased or decreased. The second process units 280 may also be arranged in an M×N array (M and N being natural numbers of 1 or larger) similarly to the first process units 260. Here, M and N may be equal to A and B, respectively. Alternatively, both the first process units 260 and the second process units 280 may be provided on only the one side of the transfer chamber 240. In another case, the first process units 260 and the second process units 280 may be provided in a single layer on the one side and the opposite side of the transfer chamber 240, respectively. In addition, unlike those described above, the first process units 260 and the second process units 280 may be provided in various arrangements.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has a plurality of slots (not illustrated) therein, on which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 18 placed on the load ports 120 and the buffer unit 220. An index rail 142 and an index robot 144 are provided in the transfer frame 140. The index rail 142 is arranged such that the longitudinal direction thereof is parallel to the second direction 14. The index robot 144 is mounted on the index rail 142 and linearly moves along the index rail 142 in the second direction 14. The index robot 144 has a base 144a, a body 144b, and a plurality of index arms 144c. The base 144a is installed so as to be movable along the index rail 142. The body 144b is coupled to the base 144a. The body 144b is movable on the base 144a along the third direction 16. Furthermore, the body 144b is rotatable on the base 144a. The plurality of index arms 144c are coupled to the body 144b and are movable forward and backward relative to the body 144b. The plurality of index arms 144c may operate individually. The index arms 144c are stacked one above another with a spacing gap therebetween along the third direction 16. Some of the index arms 144c may be used to transfer substrates W from the processing module 20 to the carriers 18, and the other index arms 144c may be used to transfer substrates W from the carriers 18 to the processing module 20. Accordingly, particles generated from substrates W to be processed may be prevented from adhering to processed substrates W in the process in which the index robot 144 transfers the substrates W between the carriers 18 and the processing module 20.

The transfer chamber 240 transfers substrates W between the buffer unit 220, the first process units 260, and the second process units 280. A guide rail 242 and a main robot 244 are provided in the transfer chamber 240. The guide rail 242 is arranged such that the longitudinal direction thereof is parallel to the first direction 12. The main robot 244 is mounted on the guide rail 242 and linearly moves on the guide rail 242 along the first direction 12.

The first process unit 260 and the second process unit 280 may sequentially perform processes on one substrate W. For example, the first process unit 260 may perform a chemical process, a rinsing process, and a first drying process on the substrate W, and the second process unit 280 may perform a second drying process on the substrate W. In this case, an organic solvent may be used in the first drying process, and a supercritical fluid may be used in the second drying process. An isopropyl alcohol (PIA) solution may be used as the organic solvent, and carbon dioxide ($CO_2$) may be used as the supercritical fluid. Alternatively, the first process unit 260 may not perform the first drying process.

Figure 2:
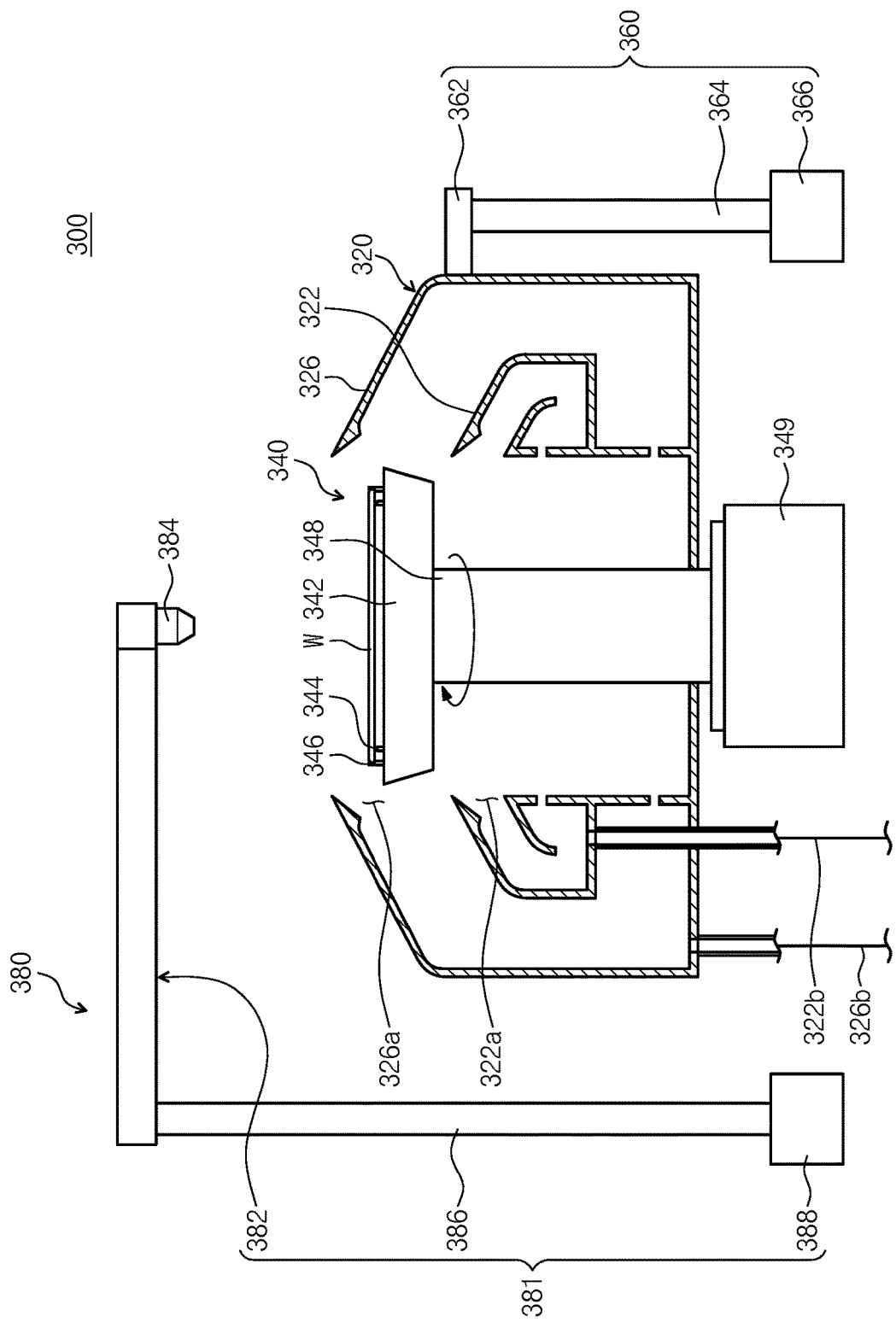
FIG. 2 is a sectional view illustrating an apparatus for cleaning a substrate in a first process unit of FIG. 1.

Hereinafter, a substrate processing apparatus 300 provided in the first process unit 260 will be described. FIG. 2 is a sectional view illustrating the apparatus 300 for cleaning the substrate W in the first process unit 260 of FIG. 1. Referring to FIG. 2, the substrate processing apparatus 300 has a processing vessel 320, a spin head 340, a lifting unit 360, and a dispensing member 380. The processing vessel 320 has a space in which the substrate W is processed. The processing vessel 320 is open at the top thereof. The processing vessel 320 has an inner recovery bowl 322 and an outer recovery bowl 326. The recovery bowls 322 and 326 recover different processing fluids used in processes. The inner recovery bowl 322 has an annular ring shape surrounding the spin head 340, and the outer recovery bowl 326 has an annular ring shape surrounding the inner recovery bowl 322. An inner space 322a of the inner recovery bowl 322 and a space 326a between the outer recovery bowl 326 and the inner recovery bowl 322 function as inlets through which the processing fluids are introduced into the inner recovery bowl 322 and the outer recovery bowl 326, respectively. The recovery bowls 322 and 326 have recovery lines 322b and 326b connected thereto, which vertically extend downward from bottom surfaces of the recovery bowls 322 and 326. The recovery lines 322b and 326b drain the processing liquids out of the recovery bowls 322 and 326. The drained processing liquids may be reused through an external processing liquid regeneration system (not illustrated).

The spin head 340 is disposed inside the processing vessel 320. The spin head 340 supports and rotates the substrate W during processing. The spin head 340 has a body 342, support pins 334, chuck pins 346, and a support shaft 348. The body 342 has an upper surface with a substantially circular shape when viewed from above. The support shaft 348 that is rotatable by a motor 349 is fixedly coupled to a bottom surface of the body 342. The plurality of support pins 334 are arranged on an edge portion of the upper surface of the body 342 with a predetermined spacing gap therebetween and protrude upward from the body 342. The support pins 334 are arranged to have an annular ring shape as a whole by a combination thereof. The support pins 334 support the edge of the back side of the substrate W such that the substrate W is spaced apart from the upper surface of the body 342 by a predetermined distance. The plurality of chuck pins 346 are disposed farther away from the center of the body 342 than the support pins 334. The chuck pins 346 protrude upward from the body 342. The chuck pins 346 support the side of the substrate W to prevent the substrate W from deviating from the correct position to a side when the spin head 340 rotates. The chuck pins 346 linearly move between a standby position and a support position along the radial direction of the body 342. The standby position is farther away from the center of the body 342 than the support position. The chuck pins 346 are located in the standby position when the substrate W is loaded onto or unloaded from the spin head 340. The chuck pins 346 are located in the support position when a process is performed on the substrate W. In the support position, the chuck pins 346 are brought into contact with the side of the substrate W.

The lifting unit 360 linearly moves the processing vessel 320 in the vertical direction. The height of the processing vessel 320 relative to the spin head 340 varies as the processing vessel 320 is vertically moved. The lifting unit 360 has a bracket 362, a movable shaft 364, and an actuator 366. The bracket 362 is fixedly attached to an outer wall of the processing vessel 320. The movable shaft 364 is fixedly coupled to the bracket 362 and vertically moved by the actuator 366. When the substrate W is placed on the spin head 340 or lifted up from the spin head 340, the processing vessel 320 moves downward to cause the spin head 340 to protrude above the processing vessel 320. Furthermore, when a process is performed, the height of the processing vessel 320 is adjusted depending on the type of a processing liquid supplied to the substrate W such that the processing liquid is introduced into a preset recovery bowl.

Unlike that described above, the lifting unit 360 may vertically move the spin head 340 instead of the processing vessel 320.

The dispensing member 380 dispenses a processing liquid onto the substrate W. The dispensing member 380 has a nozzle support rod 382, a nozzle 384, a support shaft 386, and an actuator 388. The support shaft 386 is arranged such that the longitudinal direction thereof is parallel to the third direction 16, and the actuator 388 is coupled to a lower end of the support shaft 386. The actuator 388 rotates and lifts the support shaft 386. The nozzle support rod 382 is coupled perpendicular to an upper end of the support shaft 386 that is opposite to the lower end of the support shaft 386 to which the actuator 388 is coupled. The nozzle 384 is mounted on a bottom surface of a distal end of the nozzle support rod 382. The nozzle 382 is moved between a process position and a standby position by the actuator 388. The process position is defined as a position where the nozzle 384 is located directly above the processing vessel 320, and the standby position is defined as a position where the nozzle 384 deviates from directly above the processing vessel 320. One or more dispensing members 380 may be provided. In the case where the plurality of dispensing members 380 are provided, a chemical, a rinsing solution, and an organic solvent may be dispensed through the different dispensing members 380. The chemical may be a liquid that has the property of strong acid or strong base. The rinsing liquid may be deionized water. The organic solvent may be a mixture of isopropyl alcohol vapor and inert gas, or may be an isopropyl alcohol solution.

Figure 3:
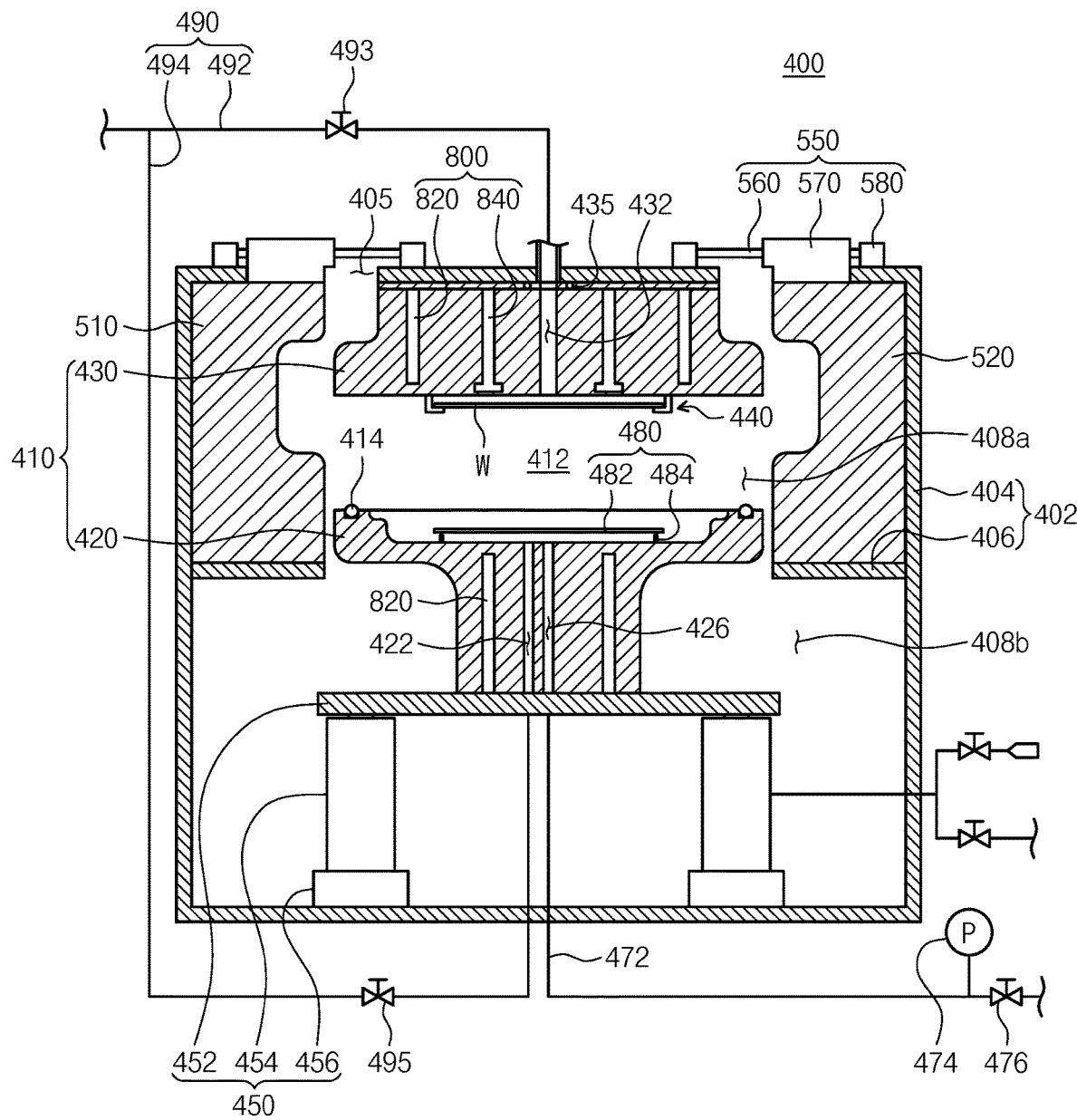
FIG. 3 is a sectional view illustrating an apparatus for drying the substrate in a second process unit of FIG. 1.
Figure 4:
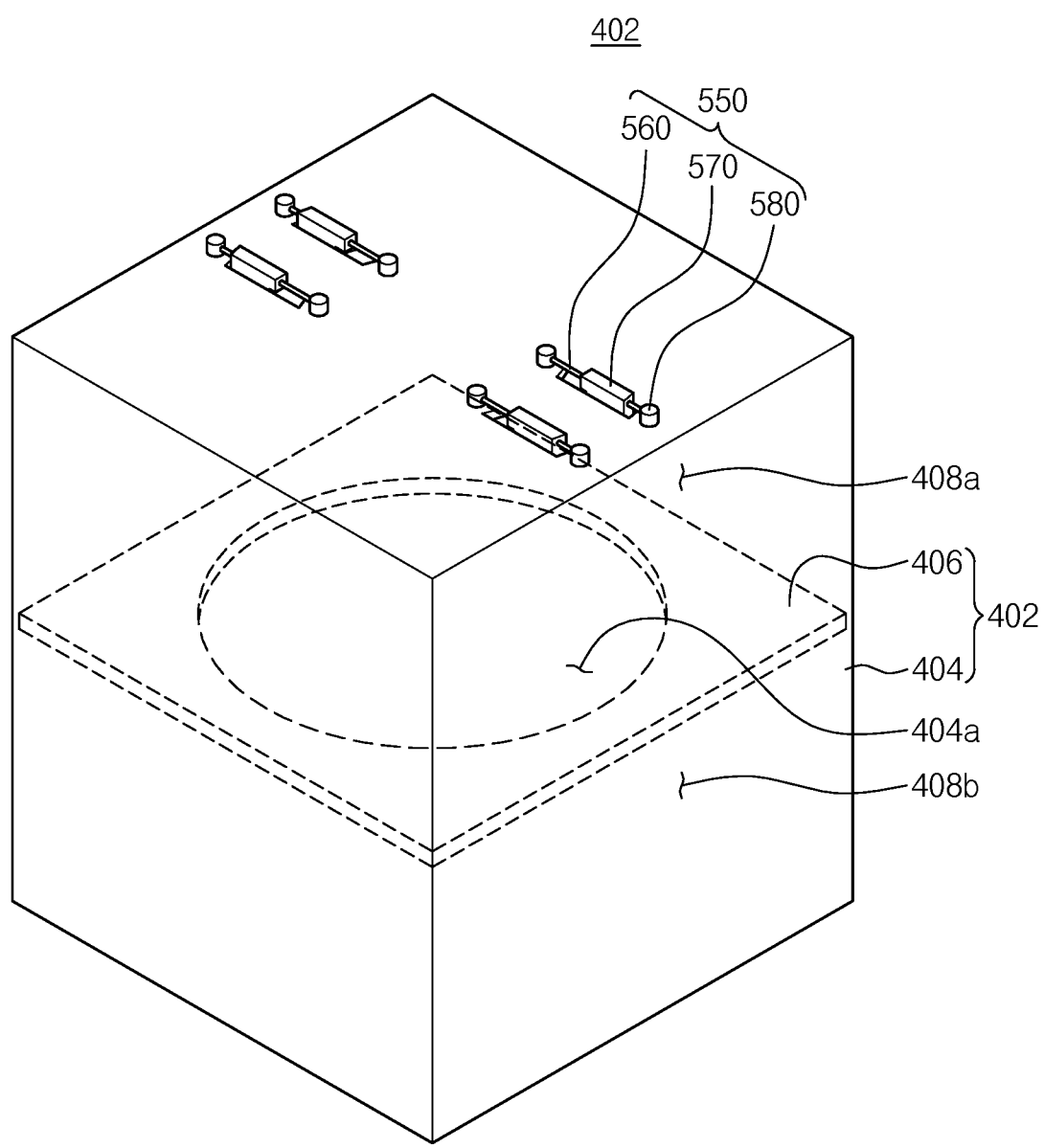
FIG. 4 is a perspective view illustrating a housing of FIG. 3.

A substrate processing apparatus 400 for performing the second drying process on the substrate W is provided in the second process unit 280. The substrate processing apparatus 400 secondly dries the substrate W that is firstly dried in the first process unit 260. The substrate processing apparatus 400 performs a drying process on the substrate W on which the organic solvent remains. The substrate processing apparatus 400 may perform the drying process on the substrate W by using a supercritical fluid. FIG. 3 is a sectional view illustrating the apparatus 400 for drying the substrate W in the second process unit 280 of FIG. 1, and FIG. 4 is a perspective view illustrating a housing 402 of FIG. 3. Referring to FIGS. 3 and 4, the substrate processing apparatus 400 includes the housing 402, a process chamber 410, a substrate support unit 440, a lifting member 450, a blocking member 480, an exhaust unit 470, a fluid supply unit 490, a clamping member 500, movable members 550, and a temperature adjustment unit 800.

The housing 402 includes a body 404 and an intermediate plate 406. The body 404 may have the shape of a container with a space inside. For example, the body 404 may have a rectangular parallelepiped shape. The body 404 has slit-shaped through-holes 405 formed in an upper surface thereof. The through-holes 405 have the same longitudinal direction at different positions. According to an embodiment, the body 404 may have four through-holes 405, in which two of the through-holes 405 may be located on one side and the other two through-holes 405 may be located on an opposite side. Alternatively, the body 404 may have an even number of through-holes 405, for example, two, six, or more through-holes 405. The through-holes 405 function as passages through which the movable members 550 and the clamping member 500 are connected.

The intermediate plate 406 is located in the body 404. The intermediate plate 406 divides the inside of the body 404 into an upper space 408a and a lower space 408b. The intermediate plate 406 has a plate shape with an empty space 404a. A second body 420 may be inserted into the empty space 404a. The empty space 404a may have a larger diameter than a lower end of the second body 420. The process chamber 410 and the clamping member 500 may be located in the upper space 408a, and the lifting member 450 may be located in the lower space 408b. The movable members 550 may be located on an outer wall of the housing 402.

The process chamber 410 has a processing space 412 therein, in which the substrate W is processed. The process chamber 410 seals the processing space 412 from the outside while the substrate W is processed. The process chamber 410 includes the second body 420, a first body 430, and a sealing member 414. A bottom surface of the second body 420 has a step. The second body 420 has a shape in which a central portion of the bottom surface thereof is located in a lower position than an edge portion of the bottom surface. The second body 420 is vertically movable between the upper space 408a and the lower space 408b of the body 404 by the lifting member 450. A lower supply port 422 and an exhaust port 426 are formed in the bottom surface of the second body 420. The lower supply port 422 may be eccentrically located off the central axis of the second body 420 when viewed from above. The lower supply port 422 functions as a passage through which a supercritical fluid is supplied into the processing space 412.

The first body 430 is combined with the second body 420 to form the processing space 412 inside. The first body 430 is provided as an upper body 430 located over the second body 420, and the second body 420 is provided as a lower body 420 located under the first body 430. The first body 430 is located in the upper space 408a of the housing 402. The first body 430 is coupled to a ceiling surface of the body 404 by a buffer member 435. The buffer member 435 may be formed of an elastic material. The buffer member 435 may be a plate spring or a coil spring. For example, the buffer member 435 may be a spring. An upper surface of the first body 430 has a step. The first body 430 has a shape in which a central portion of the upper surface thereof is located in a higher position than an edge portion of the upper surface. The first body 430 has an upper supply port 432 formed therein. The upper supply port 432 functions as a passage through which a supercritical fluid is supplied into the processing space 412. The upper supply port 432 may be located to coincide with the center of the first body 430. According to an embodiment, the first body 430 and the second body 420 may be formed of metal.

The sealing member 414 seals the gap between the first body 430 and the second body 420. The sealing member 414 is located between the first body 430 and the second body 420. The sealing member 414 has an annular ring shape. For example, the sealing member 414 may be implemented with an O-ring. The sealing member 414 may be provided on a lower end surface of the first body 430 or on an upper end surface of the second body 420. In this embodiment, the sealing member 414 is provided on the upper end surface of the second body 420. The second body 420 has a sealing groove formed on the upper end surface thereof, into which the sealing member 414 is inserted. A portion of the sealing member 414 is inserted into the sealing groove, and the remaining portion protrudes above the sealing groove. The sealing member 414 may be formed of an elastic material.

Figure 5:
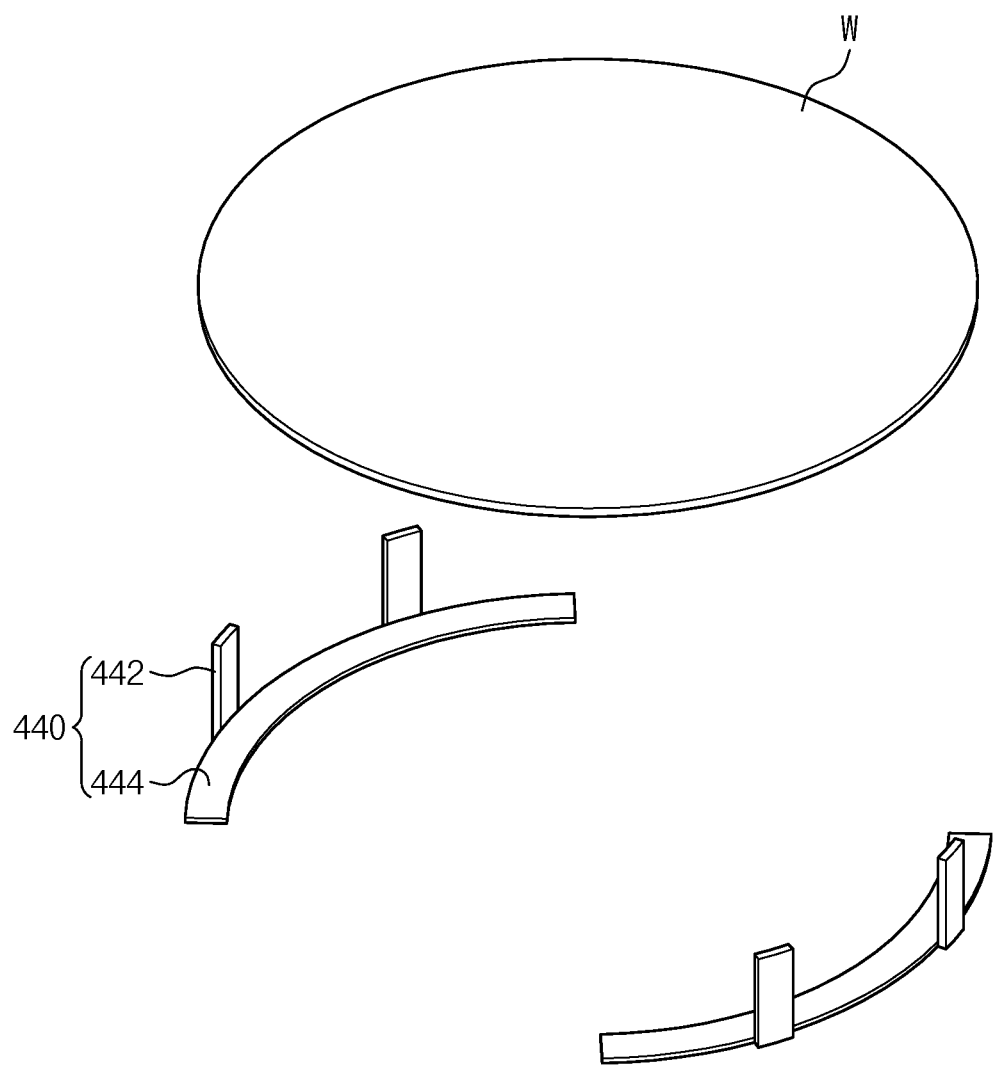
FIG. 5 is a perspective view illustrating a substrate support unit of FIG. 3.

The substrate support unit 440 supports the substrate W in the processing space 412. FIG. 5 is a perspective view illustrating the substrate support unit 440 of FIG. 3. Referring to FIG. 5, the substrate support unit 440 supports the substrate W such that a surface of the substrate W that is to be processed faces upward. The substrate support unit 440 includes support rods 442 and substrate holding parts 444. The support rods 442 have a bar shape extending downward from the bottom surface of the first body 430. The number of support rods 442 may be four. The substrate holding parts 444 support an edge region of the bottom side of the substrate W. The plurality of substrate holding parts 444 support different regions of the substrate W. For example, the number of substrate holding parts 444 may be two. The substrate holding parts 444 have a rounded plate shape when viewed from above. The substrate holding parts 444 are located inward of the support rods 442 when viewed from above. The substrate holding parts 444 are combined together to form a ring shape. The substrate holding parts 444 are spaced apart from each other.

Referring again to FIGS. 3 and 4, the lifting member 450 adjusts the relative position between the first body 430 and the second body 420. The lifting member 450 raises or lowers one of the first body 430 and the second body 420 to cause the one body to be spaced apart from, or brought into close contact with, the other body. The lifting member 450 raises or lowers one of the first body 430 and the second body 420 to cause the process chamber 410 to be moved to an open position or a closed position. Here, the open position is a position where the first body 430 and the second body 420 are spaced apart from each other, and the closed position is a position where the first body 430 and the second body 420 are brought into close contact with each other. That is, in the open position, the processing space 412 is open to the outside, and in the closed position, the processing space 412 is sealed from the outside. In this embodiment, the lifting member 450 is located in the lower space 408b to raise or lower the second body 420, and the position of the first body 430 is fixed. Alternatively, the second body 420 may be fixed, and the first body 430 may be raised or lowered relative to the second body 420. In this case, the lifting member 450 may be located in the upper space 408a.

The lifting member 450 includes a support plate 452, lifting shafts 454, and actuators 456. The support plate 452 supports the second body 420 in the lower space 408b. The second body 420 is fixedly coupled to the support plate 452. The support plate 452 has a circular plate shape. The support plate 452 has a larger diameter than the empty space 404a. Accordingly, even in the closed position, the lower end of the second body 420 is located in the lower space 408b. The lifting shafts 454 support a bottom surface of the support plate 452 in the lower space 408b. The lifting shafts 454 are fixedly coupled to the support plate 452. The plurality of lifting shafts 454 are arranged along the circumferential direction. The actuators 456 raise or lower the lifting shafts 454. The actuators 456 are coupled to the lifting shafts 454 in a one-to-one manner. When driving forces are provided to the actuators 456, the second body 420 and the lifting shafts 454 are raised, and the first body 430 and the second body 420 are moved to the closed position in which the processing space 412 is closed. The driving forces are identically provided to, or released from, the actuators 456. Accordingly, the plurality of lifting shafts 454 may be located at the same height while being raised or lowered, and the support plate 452 and the second body 420 may be raised or lowered in a horizontal state. For example, the actuators 456 may be cylinders or motors.

The blocking member 480 prevents the supercritical fluid supplied from the lower supply port 422 from being directly supplied to the non-processed surface of the substrate W. The blocking member 480 includes a blocking plate 482 and support rods 484. The blocking plate 482 is located between the lower supply port 422 and the substrate support unit 440. The blocking plate 482 has a circular plate shape. The blocking plate 482 has a diameter smaller than the inner diameter of the second body 420. The blocking plate 482 has a diameter sufficient to hide both the lower supply port 422 and the exhaust port 426, when viewed from above. For example, the blocking plate 482 may have a diameter corresponding to, or larger than, the diameter of the substrate W. The support rods 484 support the blocking plate 482. The plurality of support rods 484 are arranged along the circumferential direction of the blocking plate 482. The support rods 484 are spaced apart from each other by a predetermined interval.

The exhaust unit 470 releases the atmosphere of the processing space 412. Process by-products generated in the processing space 412 are released through the exhaust unit 470. The release of the by-products may be naturally or forcedly performed. Furthermore, the exhaust unit 470 may adjust the pressure in the processing space 412 while releasing the process by-products. The exhaust unit 470 includes an exhaust line 472 and a pressure measurement member 474. The exhaust line 472 is connected to the exhaust port 426. An exhaust valve 476 installed on the exhaust line 472 may adjust the displacement volume of the processing space 412. The pressure measurement member 474 is installed in the exhaust line 472 and measures the pressure in the exhaust line 472. The pressure measurement member 474 is located upstream of the exhaust valve 476 with respect to the exhaust direction. The pressure in the processing space 412 may be reduced to the atmospheric pressure or a pressure corresponding to the outside of the process chamber 410 by the exhaust unit 470.

The fluid supply unit 490 supplies a processing fluid into the processing space 412. The processing fluid is supplied in a supercritical state at its critical temperature and critical pressure. The fluid supply unit 490 includes an upper supply line 492 and a lower supply line 494. The upper supply line 492 is connected to the upper supply port 432. The processing fluid flows sequentially through the upper supply line 492 and the upper supply port 432 and is then supplied into the processing space 412. An upper valve 493 is installed on the upper supply line 492. The upper valve 493 opens or closes the upper supply line 492. The lower supply line 494 connects the upper supply line 492 and the lower supply port 422. The lower supply line 494 branches from the upper supply line 492 and is connected to the lower supply port 422. That is, the processing fluids supplied from the upper supply line 492 and the lower supply line 494 may be of the same type. The processing fluid flows sequentially through the lower supply line 494 and the lower supply port 422 and is then supplied into the processing space 412. A lower valve 495 is installed on the lower supply line 494. The lower valve 495 opens or closes the lower supply line 494.

According to an embodiment, the processing fluid may be supplied from the lower supply port 422 that faces the non-processed surface of the substrate W, and thereafter the processing fluid may be supplied from the upper supply port 432 that faces the surface of the substrate W that is to be processed. Accordingly, the processing fluid may be supplied into the processing space 412 through the lower supply line 494 and may then be supplied into the processing space 412 through the upper supply line 492. The reason is to prevent the initially supplied processing fluid from being supplied to the substrate W below the critical pressure or the critical temperature.

The clamping member 500 clamps the first body 430 and the second body 420 that are located in the closed position. Accordingly, the first body 430 and the second body 420 may be prevented from being spaced apart from each other even though the pressure in the processing space 412 rises during processing.

Figure 6:
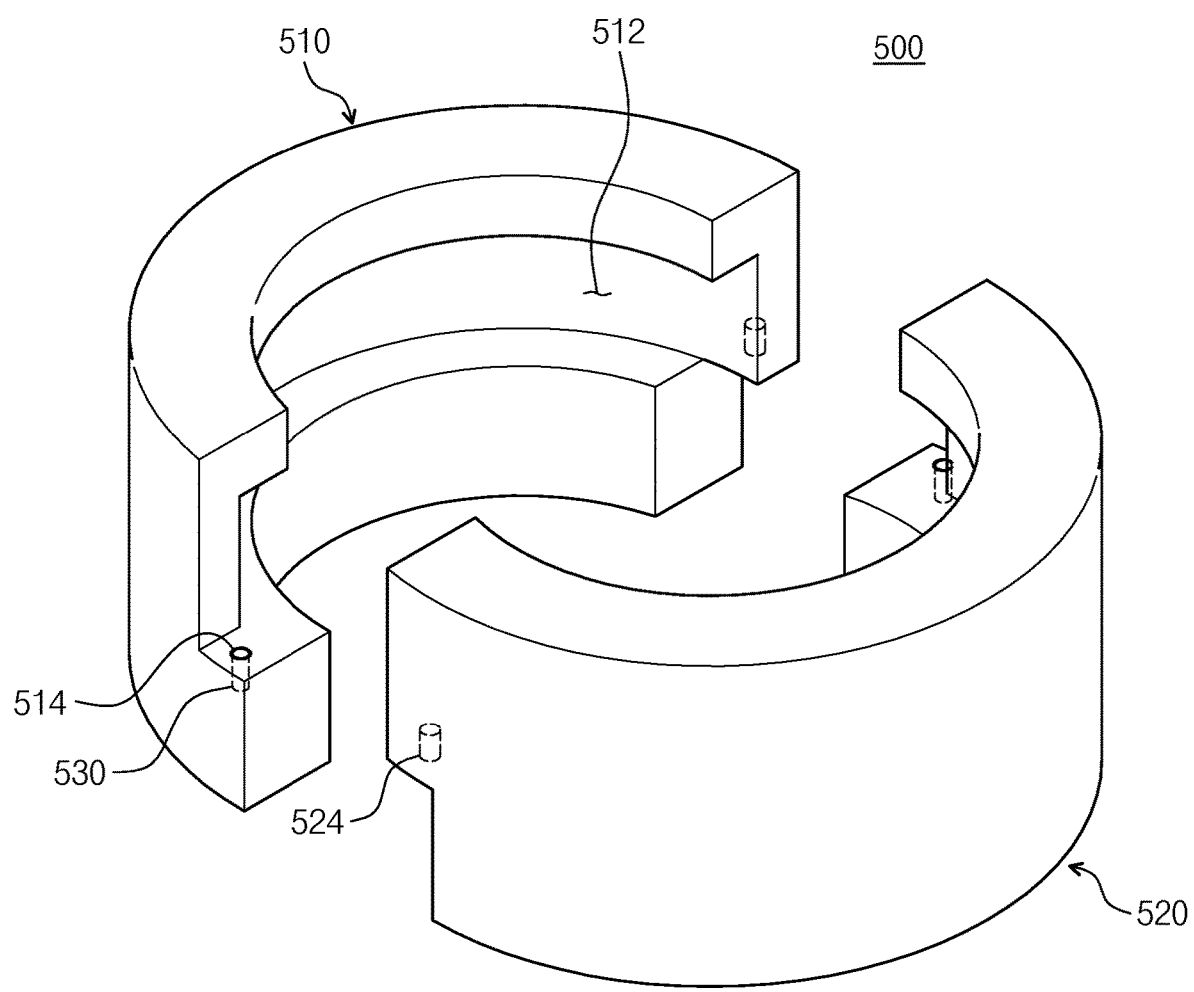
FIG. 6 is a perspective view illustrating a clamping member of FIG. 3.
Figure 7:
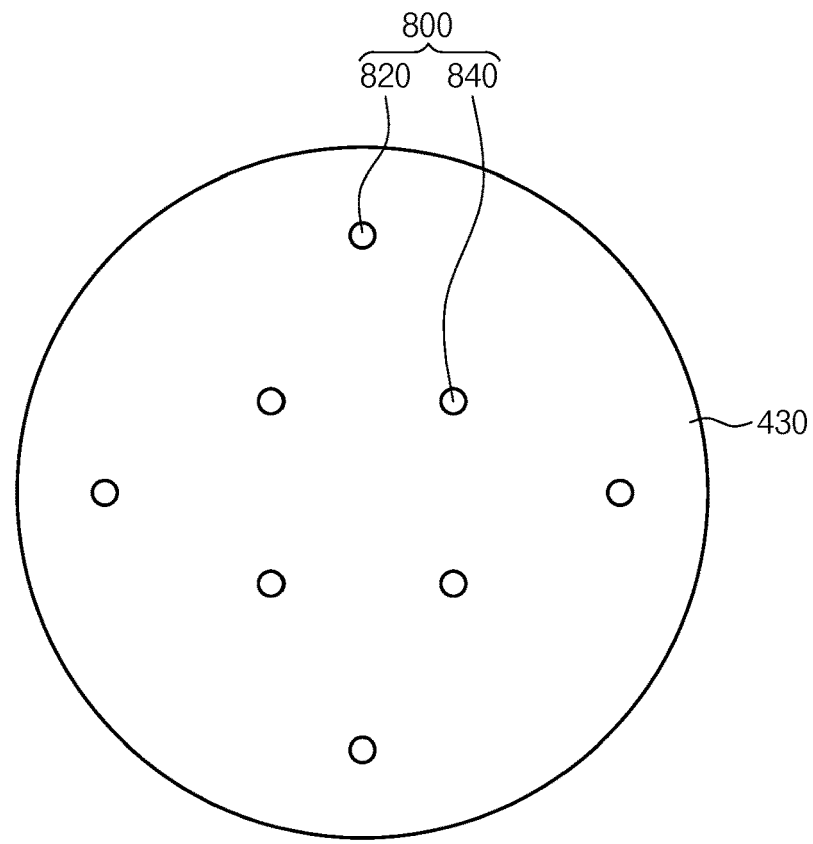
FIG. 7 is a plan view illustrating heaters and coolers of FIG. 3.
Figure 8:
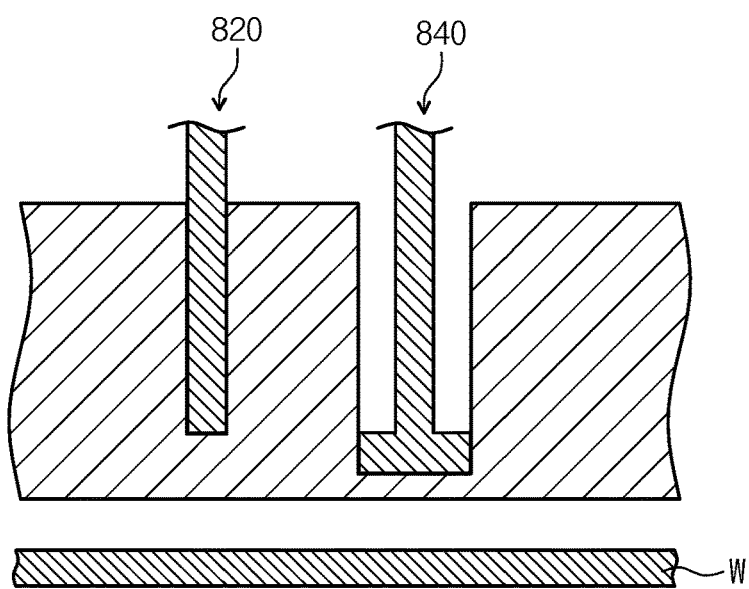
FIG. 8 is an enlarged sectional view illustrating a heater and a cooler of FIG. 3.
Figure 9:
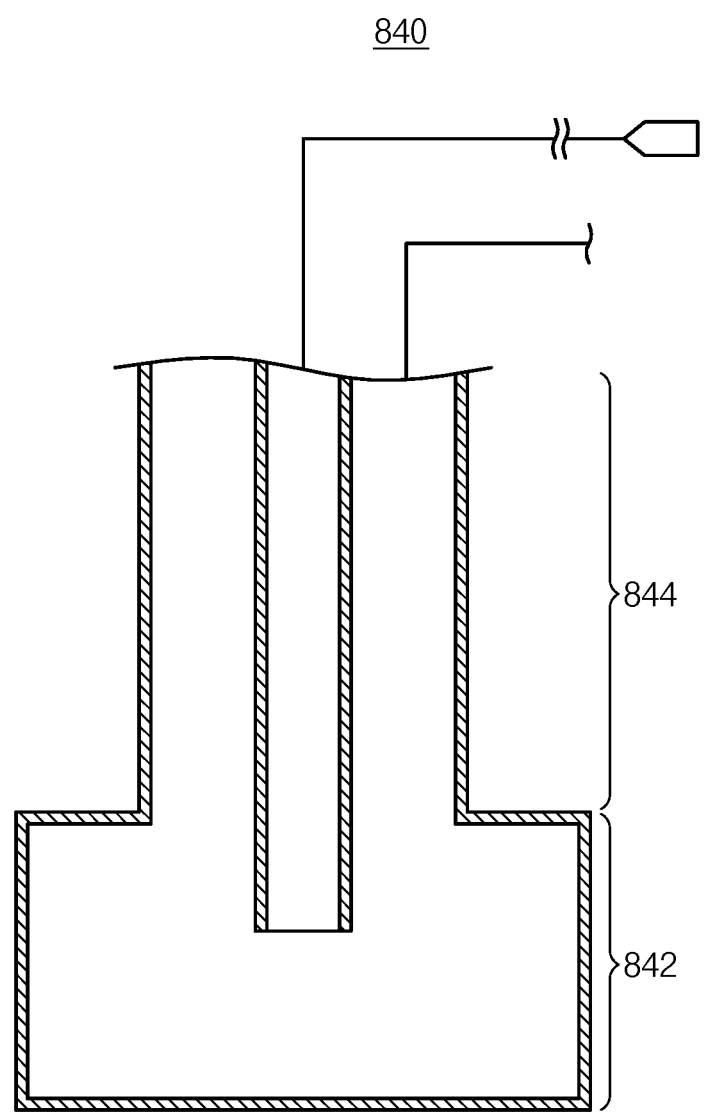
FIG. 9 is a detailed sectional view illustrating a cooler of FIG. 3.
Figure 10:
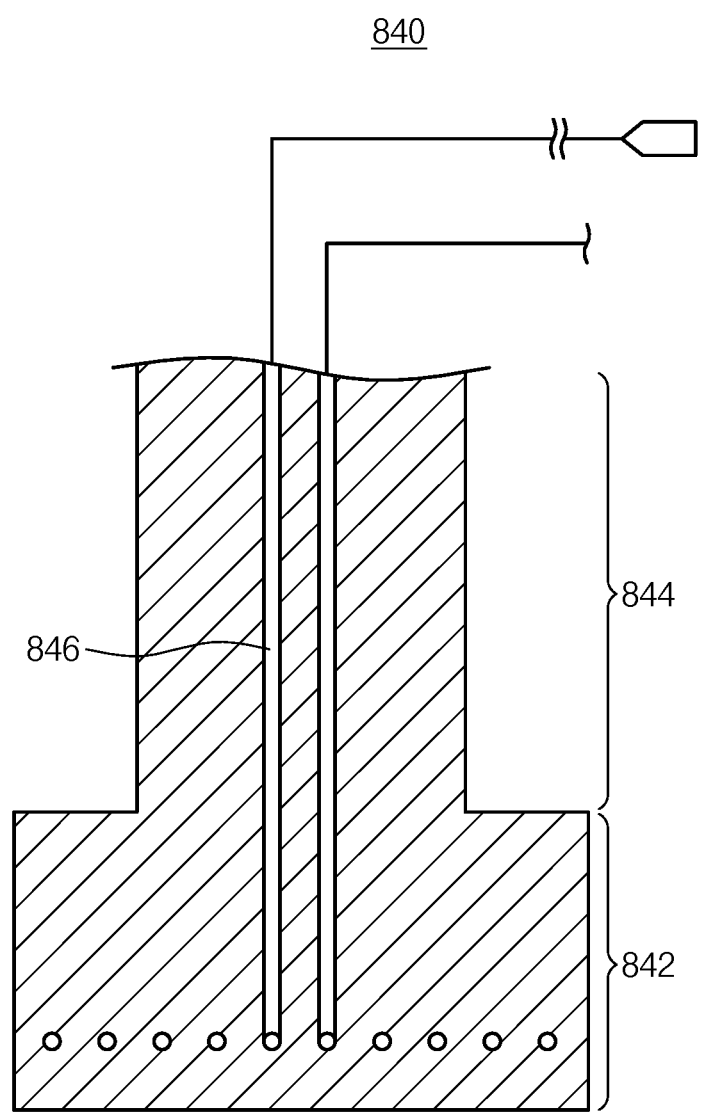
FIGS. 10 and 11 are views illustrating other embodiments of the cooler of FIG. 9.
Figure 11:
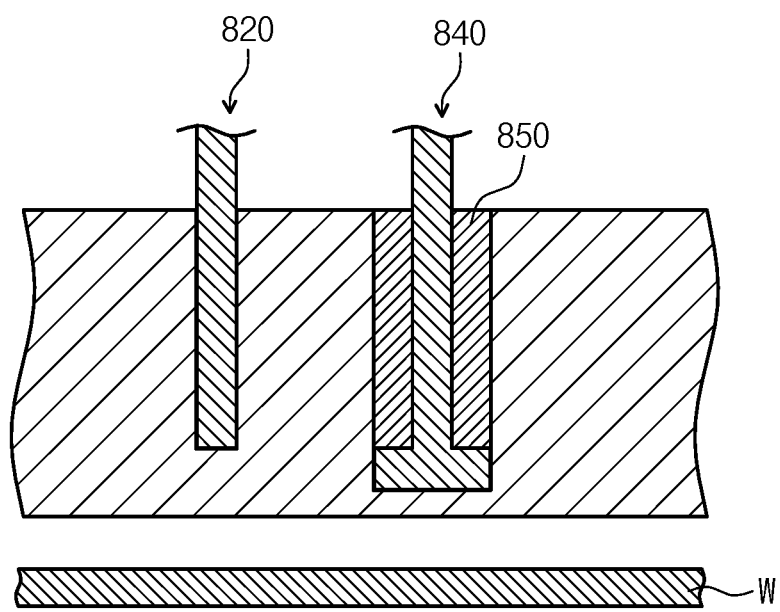

FIG. 6 is a perspective view illustrating the clamping member 500 of FIG. 3. Referring to FIG. 6, the clamping member 500 includes a first clamp 510, a second clamp 520, and locking pins 530. The first clamp 510 and the second clamp 520 are located on both sides of the process chamber 410. According to an embodiment, the first clamp 510 and the second clamp 520 are located to face each other with the process chamber 410 therebetween. The first clamp 510 and the second clamp 520 have a shape surrounding the process chamber 410. Each of the first clamp 510 and the second clamp 520 has a clamp groove 512 formed on an inner surface that faces the process chamber 410. Edge portions of the first and second bodies 430 and 420 in the closed position may be inserted into the clamp grooves 512. That is, the edge portion of the first body 430 and the edge portion of the second body 420 are provided as clamped regions. The vertical length of the clamp grooves 512 is longer than the length from an upper end of the edge portion of the first body 430 in the closed position to a lower end of the edge portion of the second body 420 in the closed position.

The clamping member 500 is movable to a clamping position or an unclamping position. Here, the clamping position is defined as a position where the first clamp 510 and the second clamp 520 move toward each other to clamp the first body 430 and the second body 420, and the unclamping position is defined as a position where the first clamp 510 and the second clamp 520 are separated from the first body 430 and the second body 420. In the clamping position, the first clamp 510 and the second clamp 520 are combined together to form an annular ring shape. For example, one of the first clamp 510 and the second clamp 520 may have a vertical cross section with the shape of "C" or " ⊂ ", and the other may have a vertical cross section that is symmetric to the vertical cross section of the one clamp with respect to the vertical axis.

One side surface of the first clamp 510 that is brought into contact with the second clamp 520 has a step. An opposite side surface of the second clamp 520 that is brought into contact with the first clamp 510 has a step. The one side surface of the first clamp 510 and the opposite side surface of the second clamp 520 have shapes complementary to each other. According to an embodiment, the one side surface of the first clamp 510 may have a step with an upper end longer than its lower end, and the opposite side surface of the second clamp 520 may have a step with an upper end shorter than its lower end. A first pin recess 514 in which the locking pin 530 is located is formed in the stepped region of the first clamp 510, and a second pin recess 524 is formed in the stepped region of the second clamp 520. The first pin recess 514 and the second pin recess 524 are directed in a direction perpendicular to the moving direction of the clamping member 500. In the clamping position, the first pin recess 514 and the second pin recess 524 are located to face each other. According to an embodiment, in the clamping position, the locking pin 530 may protrude from the first pin recess 514 and may be inserted into the second pin recess 524. Furthermore, the first pin recess 514 may be additionally formed in the second clamp 520, and the second pin recess 524 may be additionally formed in the first clamp 510.

Referring again to FIGS. 3 and 4, the movable members 550 move the clamping member 500 between the clamping position and the unclamping position. The movable members 550 move the clamping member 500 in the perpendicular direction to the moving direction of the process chamber 410. Each of the movable members 550 includes a guide rail 560, a bracket 570, and an actuating member 580. The guide rail 560 is located outside the housing 402. The guide rail 560 is located adjacent to the upper space 408a in which the first body 430 is located. The guide rail 560 is mounted on an upper surface of the housing 402. The guide rail 560 has a longitudinal direction perpendicular to the moving direction of the process chamber 410. The guide rails 560 of the movable members 550 have the same longitudinal direction. According to an embodiment, the guide rails 560 and the through-holes 405 are provided in equal numbers. The guide rails 560 have a longitudinal direction parallel to the through-holes 405. The guide rails 560 are located to overlap the through-holes 405 when viewed from above. The bracket 570 fixedly couples the guide rail 560 and the clamping member 500. As many brackets 570 as the guide rails 560 are provided. According to an embodiment, when viewed from above, the first clamp 510 may be connected to the guide rails 560 located on one side, and the second clamp 520 may be connected to the guide rails 560 located on the other side. The actuating member 580 actuates the guide rail 560 to cause the clamping member 500 to move to the clamping position or the unclamping position along the longitudinal direction of the guide rail 560.

The temperature adjustment unit 800 adjusts the temperature of the processing space 412. According to an embodiment, the temperature adjustment unit 800 may adjust the temperature of the processing space 412 to a temperature higher than the critical temperature of the processing fluid. The temperature adjustment unit 800 includes a heating member 820 and a cooling member 840. The heating member 820 heats the processing space 412. The heating member 820 heats the processing space 412 such that the processing fluid supplied into the processing space 412 is heated to the critical temperature or more. The heating member 820 includes a plurality of heaters 820. The upper body 430 has a plurality of heating recesses formed therein, and the plurality of heaters 820 are inserted into the respective heating recesses. The lower body 420 has a plurality of heating recesses formed therein, and the plurality of heaters 820 are inserted into the respective heating recesses. The heating recesses formed in the upper body 430 may vertically extend downward from the upper surface of the upper body 430, and the heating recesses formed in the lower body 420 may vertically extend upward from the bottom surface of the lower body 420. The heating recesses and the heaters 820 have the same width. The heaters 820 have the same width for each region. Accordingly, the entire regions of the heaters 820 are brought into contact with the upper body 430 and the lower body 420, and therefore the efficiency of heat conduction between the heaters 820 and the upper and lower bodies 430 and 420 may be improved. The heaters 820 have the same shape. The heaters 820 have a bar shape extending in one direction. The longitudinal direction of the heaters 820 is different from the moving direction of the clamping member 500. According to an embodiment, the longitudinal direction of the heaters 820 may be parallel to the moving direction of the lower body 420. The shape and the longitudinal direction of the heaters 820 may improve the durability of the upper body 430 and the lower body 420 when high pressure is applied to the upper body 430 and the lower body 420. Furthermore, the shape and the longitudinal direction of the heaters 820 facilitate connection of a power source to the heaters 820 without interference of the clamping member 500. In contrast, in the case where the longitudinal direction of the heaters 820 is perpendicular to the moving direction of the lower body 420 or the heaters 820 have a plate shape, the upper body 430 and the lower body 420 may be damaged when high pressure is applied thereto. The heaters 820 may be combined together to form an annular ring shape when viewed from above. For example, the heaters 820 installed in the upper body 430 may be located farther away from the central axis of the bodies than the heaters 820 installed in the lower body 420.

The cooling member 840 cools the processing space 412. The cooling member 840 cools a specific region of the processing space 412 for a uniform temperature distribution over the entire region of the processing space 412. The cooling member 840 includes a plurality of coolers 840. The upper body 430 has a plurality of cooling recesses formed therein, and the plurality of coolers 840 are inserted into the respective cooling recesses. The cooling recesses vertically extend downward from the upper surface of the upper body 430. Each of the cooling recesses has the same width from top to bottom. In contrast, each of the coolers 840 has different widths according to regions. Accordingly, the thermal conductivities between the cooler 840 and regions of the upper body 430 differ from each other. For example, a region of the upper body 430 that is close to the cooler 840 has a lower temperature than a region of the upper body 430 that is farther away from the cooler 840.

Hereinafter, the coolers 840 will be described in more detail. The coolers 840 have a bar shape, the longitudinal direction of which is parallel to the heaters 820. Each of the coolers 840 has a first part 842 and a second part 844. The first part 842 is located closer to the processing space 412 than the second part 844. Furthermore, the first part 842 is located closer to the processing space 412 than the heaters 820. The first part 842 includes a lower end of the cooler 840, and the second part 844 includes an upper end of the cooler 840. The second part 844 extends upward from the first part 842. That is, the lower end of the cooler 840 is located in a lower position than the lower ends of the heaters 820. The first part 842 has a larger width than the second part 844. The first part 842 has the same width as the corresponding cooling recess. Accordingly, the first part 842 is brought into contact with the upper body 430 and has a first thermal conductivity for the upper body 430. In contrast, the second part 844 is spaced apart from the upper body 430 and has a second thermal conductivity for the upper body 430. According to an embodiment, the first thermal conductivity may be higher than the second thermal conductivity. That is, a region of the upper body 430 that is adjacent to the first part 842 may have a lower temperature than a region of the upper body 430 that is adjacent to the second part 844, and the second part 844 may minimize thermal interference with the heaters 820. The cooler 840 has a cooling line 846 formed therein, through which cooling water flows. The cooling line 846 may be formed such that the cooling water is introduced into the cooler 840 along the central axis thereof and discharged outside the cooler 840. Furthermore, the cooling line 846 may have a shape in which a larger amount of cooling water stays in the first part 842 than in the second part 844. For example, the cooling line 846 may have a shape in which the cooling water is introduced into the second part 844, flows through the first part 842, and then returns to the second part 844, and the cooling line 846 may have a spiral shape in the first part 842. Furthermore, the coolers 840 may be combined together to form an annular ring shape when viewed from above. In the upper body 430, the coolers 840 may be located closer to the central axis of the upper body 430 than the heaters 820. Accordingly, the central region of the processing space 412 may be prevented from being overheated.

In the above-described embodiment, the second part 844 of the cooler 840 and the upper body 430 are spaced apart from each other with a spacing gap therebetween. However, the cooling member 840 may further include an outer body 850. The outer body 850 is located in the space between the second part 844 and the upper body 430. The outer body 850 is formed of a heat insulating material that blocks heat exchange between the second part 844 and the upper body 430. Accordingly, the outer body 850 may prevent foreign matter from remaining in the space between the second part 844 and the upper body 430, while blocking heat exchange between the second part 844 and the upper body 430.

According to the embodiments of the inventive concept, the longitudinal directions of the heaters and the coolers installed in the process chamber are parallel to the moving direction of the process chamber. Accordingly, the durability of the process chamber against high pressure may be improved.

Furthermore, according to the embodiments of the inventive concept, the first part of each cooler has a higher thermal conductivity for the process chamber than the second part of the cooler. Accordingly, heat losses of the heaters may be minimized.

In addition, according to the embodiments of the inventive concept, the first part of the cooler is located closer to the processing space than the second part of the cooler and has a larger area than the second part. Accordingly, heat may be prevented from being concentrated on a specific region of the processing space, and heat losses of the heaters may be minimized.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
    a chamber having a processing space inside;
    a substrate support unit configured to support the substrate in the processing space;
    a temperature adjustment unit installed in the chamber and configured to adjust temperature in the processing space; and
    a gas supply unit configured to supply gas into the processing space;
    wherein the temperature adjustment unit includes:
        a heating member configured to heat the processing space; and
        a cooling member configured to cool the processing space, and
    wherein the cooling member is located closer to a central axis of the chamber than the heating member, and
    wherein the gas supply unit supplies the gas into the processing space such that pressure in the processing space is raised to more than critical pressure of the gas by the gas supplied into the processing space.

2. The apparatus of claim 1, wherein the heating member and the cooling member have longitudinal directions parallel to each other.

3. The apparatus of claim 2, wherein the chamber includes:
    an upper body; and
    a lower body combined with the upper body to form the processing space inside,
    wherein the apparatus further comprises an actuator configured to move at least one of the upper body and the lower body in a moving direction for a position change between a closed position in which the processing space is closed and an open position where the processing position is open, and
    wherein the longitudinal directions of the heating member and the cooling member are parallel to the moving direction.

4. The apparatus of claim 3, wherein the heating member includes a plurality of heaters with a bar shape;
    wherein the cooling member includes a plurality of coolers with a bar shape,
    wherein the heaters are combined together to have a ring shape when viewed from above, and
    wherein the coolers are combined together to have a ring shape when viewed from above.

5. The apparatus of claim 4, wherein the chamber has cooling recesses formed therein, into which the coolers are inserted, and
    wherein each of the coolers includes:
    a first part having a first thermal conductivity for the chamber; and
    a second part extending from the first part and having a second thermal conductivity for the chamber, wherein the second thermal conductivity is lower than the first thermal conductivity.

6. The apparatus of claim 5, wherein the first part is located closer to the processing space than the second part.

7. The apparatus of claim 6, wherein the first part has a larger width than the second part,
    wherein the first part is brought into contact with one surface forming a corresponding one of the cooling recesses, and
    wherein the second part is spaced apart from the one surface.

8. The apparatus of claim 7, wherein the cooling member further includes an outer body configured to surround a space between the second part and the chamber, and
    wherein the outer body is formed of a heat insulating material configured to block heat exchange between the second part and the chamber.

* * * * *